United States Patent
Kuo et al.

(10) Patent No.: US 9,362,899 B2
(45) Date of Patent: Jun. 7, 2016

(54) CLOCK REGENERATOR

(71) Applicant: TAIWAN SEMICONDUCTOR MANUFACTURING CO., LTD., Hsinchu (TW)

(72) Inventors: Ming-Zhang Kuo, Hsinchu County (TW); Ping-Lin Yang, Changhua County (TW); Cheng-Chung Lin, Hsinchu County (TW); Osamu Takahashi, Williamson County, TX (US); Sang Hoo Dhong, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 172 days.

(21) Appl. No.: 14/106,469

(22) Filed: Dec. 13, 2013

(65) Prior Publication Data

US 2015/0171832 A1 Jun. 18, 2015

(51) Int. Cl.
*H03K 5/01* (2006.01)
*H03K 5/135* (2006.01)

(52) U.S. Cl.
CPC ..................... *H03K 5/135* (2013.01)

(58) Field of Classification Search
CPC ....................................................... H03K 5/135
USPC .................................................. 327/165, 166
See application file for complete search history.

(56) References Cited

U.S. PATENT DOCUMENTS

| 5,418,934 | A | * | 5/1995 | Nugent | G06F 1/14 713/400 |
| 6,825,695 | B1 | * | 11/2004 | Dhong | G06F 1/10 326/95 |
| 8,552,785 | B2 | | 10/2013 | Kuo et al. | |
| 8,643,411 | B1 | * | 2/2014 | Goyal | H03K 19/0016 327/141 |
| 9,088,279 | B2 | * | 7/2015 | Fleischer | H03K 19/096 |
| 2003/0052546 | A1 | * | 3/2003 | Gregor | H03K 3/011 307/106 |
| 2014/0184271 | A1 | * | 7/2014 | Gurumurthy | H03K 19/0016 326/93 |

OTHER PUBLICATIONS

James Warnock et al., "Circuit Design Techniques for a First-Generation Cell Broadband Engine Processor", IEEE Journal of Solid-State Circuits, vol. 41, No. 8, Aug. 2006, pp. 1692-1706.

* cited by examiner

*Primary Examiner* — Ryan Jager
(74) *Attorney, Agent, or Firm* — McDermott Will & Emery LLP

(57) ABSTRACT

A clock regenerator includes a pulse generating module, a control logic module, a gating module and an output module. The pulse generating module is configured to receive a global clock signal and produce a periodic pulse signal triggered by a rising edge of the global clock signal. The control logic module is configured to receive a plurality of control signals and produce a pulse-type setting signal and a gating signal according to the periodic pulse signal and the control signals. The gating module is configured to produce an intermediate clock signal according to the pulse-type setting signal and the gating signal. The output module is configured to provide a local clock signal according to the intermediate clock signal.

14 Claims, 12 Drawing Sheets

CLOCK REGENERATOR

FIELD

The present disclosure relates to an electronic circuit. More particularly, the present disclosure relates to a timing circuit in a synchronous system.

BACKGROUND

In a standard digital and mixed-signal design, clock storage elements (CSE), such as flip-flops, latch circuits and registers, are required to be operated in synchrony with a reference clock signal (also called as a global clock signal). In synchronous system design, broadcasting the global clock signal in a clock network directly from its source to every clock storage element causes a significant fraction of dynamic power. In addition, it is hard to maintain quality of the original global clock signal during transmission over the clock network.

Distributed clock regenerator (DCR) is a technique that can improve performance, especially power reduction, of the clock network. Firstly, DCR provides gain to drive corresponding clock storage elements, such that a loading of the global clock source can be reduced. Secondly, DCR provides a clock gating function, which is configured to activate a local clock signal for clock storage elements in use and to deactivate the local clock signal for other idling clock storage elements. In addition, some DCRs also provide functions for testing.

In some practical applications, some control signals (e.g., a test-hold signal and a scan enable signal for testing purposes, and a clock-gating signal for power saving purposes) are utilized to determine whether the local clock signal is generated or not by the DCR. The setup time of these control signals (especially for the clock-gating signal) is usually tighter than other signals on a data path. A critical path affecting a cycling time involving the DCR usually involves the clock-gating signal, because the clock-gating signal is typically generated by complex logic circuits.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
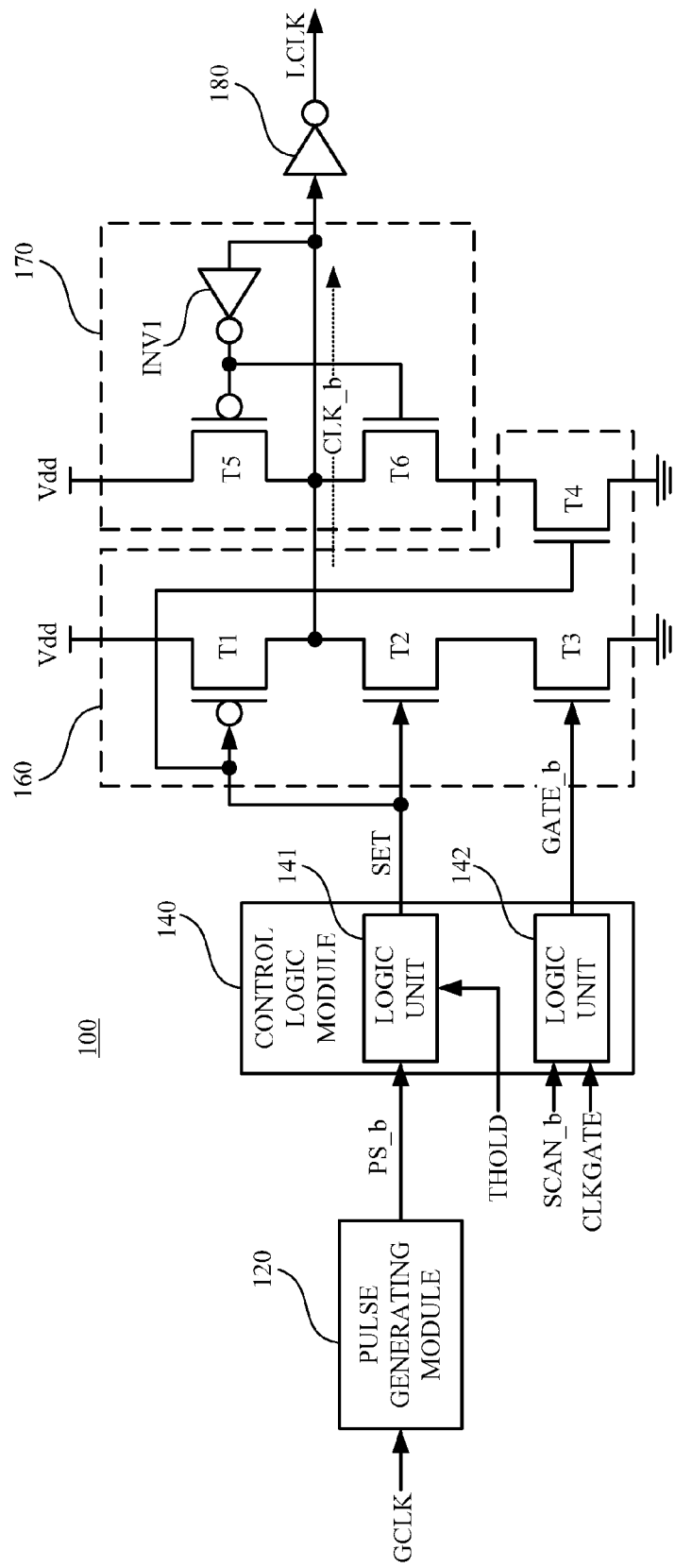
FIG. 1A is a schematic diagram illustrating a clock regenerator according to some embodiments of the present disclosure.
Figure 1B:
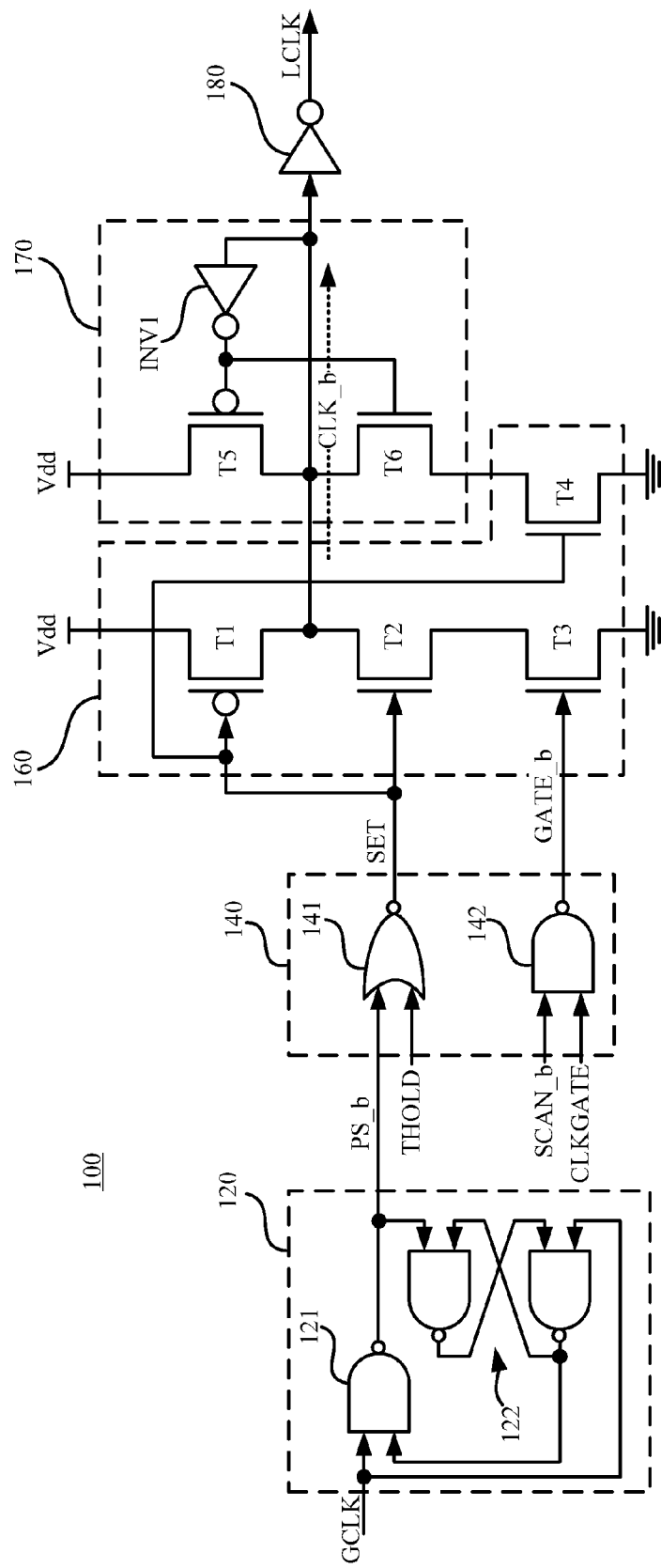
FIG. 1B is a schematic diagram illustrating circuit structure of the clock regenerator according to some embodiments of the present disclosure.
Figure 1C:
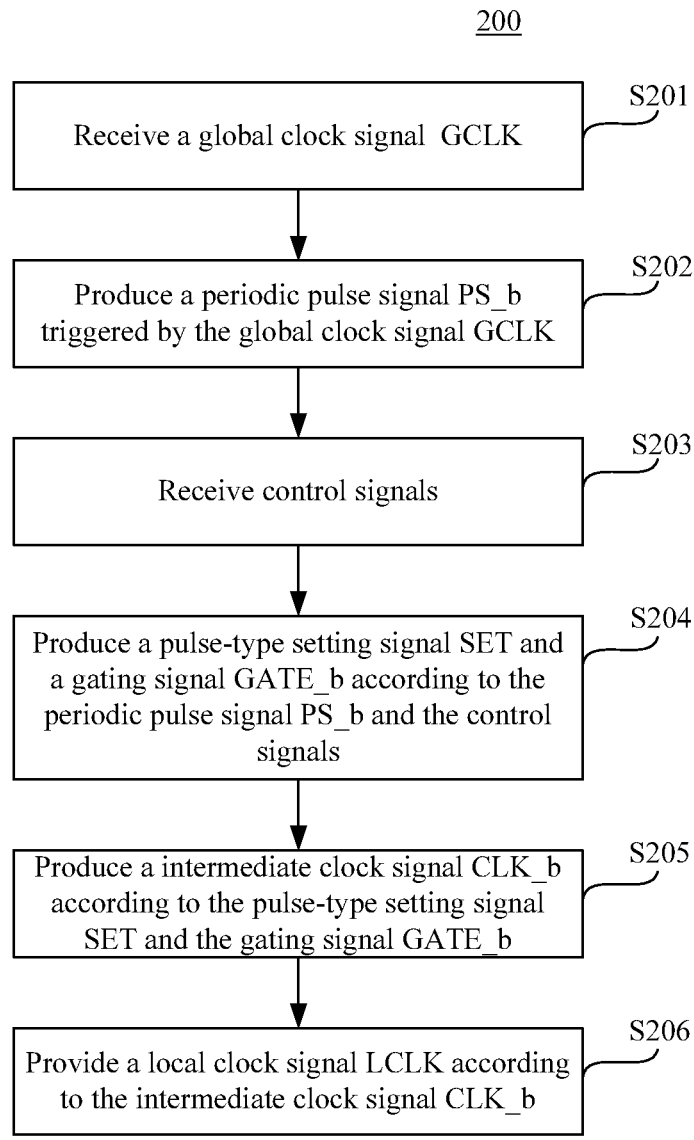
FIG. 1C is a schematic diagram illustrating a clock regenerating method according to some embodiments of the present disclosure.
Figure 2:
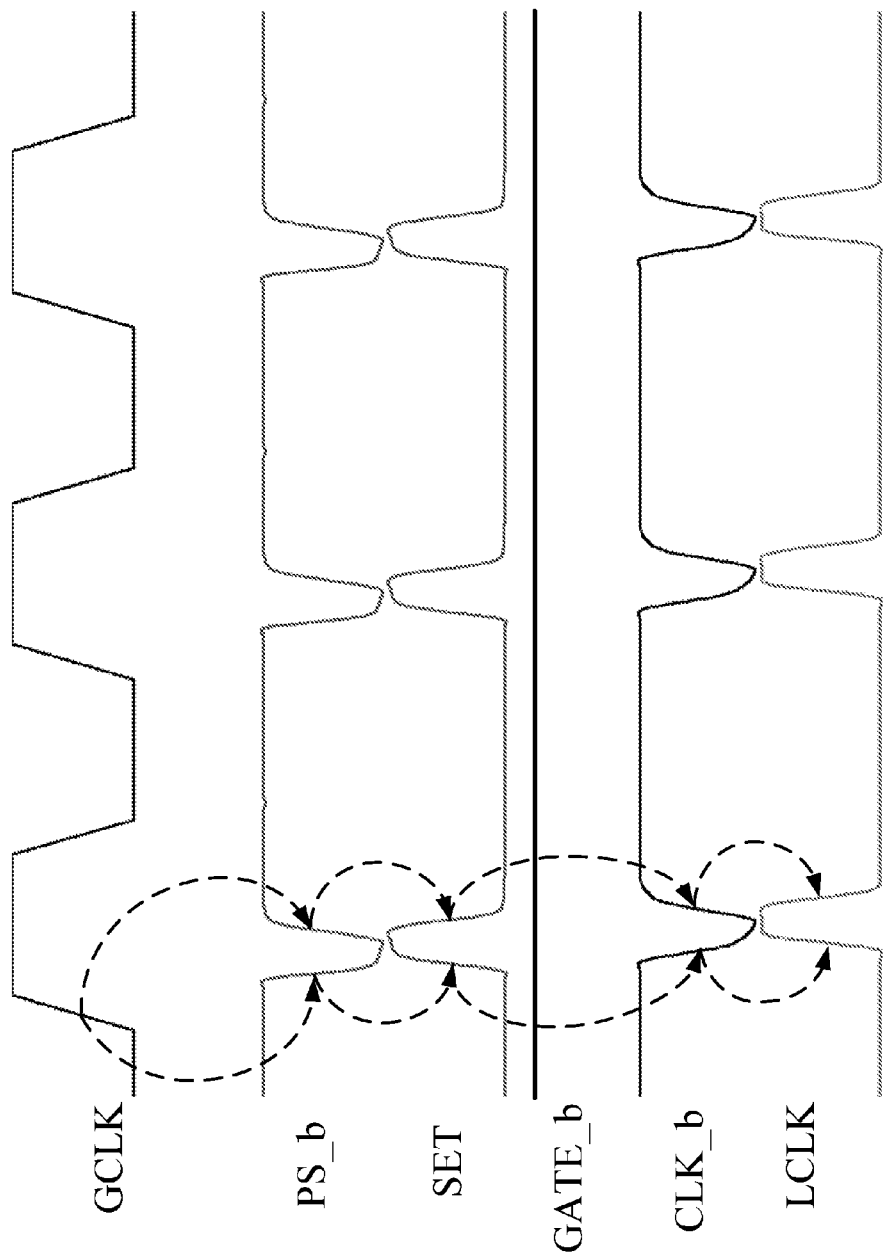
FIG. 2 is a waveform diagram illustrating related signals of the clock regenerator in FIGS. 1A and 1B.

Reference is made to FIG. 1A, FIG. 1B, FIG. 1C and FIG. 2. FIG. 1A is a schematic diagram illustrating a clock regenerator 100 according to some embodiments of the present disclosure. FIG. 1B is a schematic diagram illustrating circuit structure of the clock regenerator 100 according to some embodiments of the present disclosure. FIG. 1C is a schematic diagram illustrating a clock regenerating method 200 according to some embodiments of the present disclosure. The clock regenerating method 200 is utilized on the clock regenerator 100 in some embodiments. FIG. 2 is a waveform diagram illustrating related signals of the clock regenerator 100 according to some embodiments of the present disclosure.

As shown in FIG. 1A, the clock regenerator 100 includes a pulse generating module 120, a control logic module 140, a gating module 160 and an output module 180.

In some embodiments, the clock regenerator 100 serves as a distributed clock regenerator (DCR). The clock regenerator 100 is utilized for re-generating a local clock signal LCLK from a global clock signal GCLK. The clock regenerator 100 provides the local clock signal LCLK to corresponding clock storage elements (CSE), such as flip-flops, latch circuits and registers, which are not illustrated in figures. In some embodiments, the clock regenerator 100 shares a loading of the clock source (not illustrated in figures) by re-generating the local clock signal LCLK from the global clock signal GCLK, and the clock regenerator 100 provides gain during transmission of a synchronized clock signal (the global clock signal GCLK/the local clock signal LCLK) to each clock storage element.

As shown in FIG. 1A, the pulse generating module 120 is configured to receive the global clock signal GCLK and produce a periodic pulse signal PS_b triggered by rising edges of the global clock signal GCLK (referring to embodiments shown in FIG. 2). The control logic module 140 is coupled with the pulse generating module 120. The control logic module 140 is configured to receive a plurality of control signals (including a test-hold signal THOLD, a scan-control signal SCAN_b and a clock-gating signal CLKGATE) and produce a pulse-type setting signal SET and a gating signal GATE_b according to the periodic pulse signal PS_b and the control signals. The gating module 160 is coupled with the control logic module 140. The gating module 160 is configured to produce an intermediate clock signal CLK_b according to the pulse-type setting signal SET and the gating signal GATE_b. The output module 180 is coupled with the gating module 160. The output module 180 is configured to provide a local clock signal LCLK according to the intermediate clock signal CLK_b.

In some embodiments as shown in FIG. 1A, the clock regenerator 100 further includes an output latch circuit 170 disposed between the gating module 160 and the output module 180. The output latch circuit 170 is configured for latching the intermediate clock signal CLK_b.

As shown in FIG. 1B, FIG. 1C and FIG. 2, in operations S201 and S202, the pulse generating module 120 receives the global clock signal GCLK and produce the periodic pulse signal PS_b triggered by rising edges of the global clock signal GCLK (as shown in FIG. 2).

In some embodiments illustrated in FIG. 1B, the pulse generating module 120 includes a NAND gate 121 and a latch circuit 122. One input of the NAND gate 121 receives the global clock signal GCLK. Another input of the NAND gate 121 is coupled to an output of the latch circuit 122. An output of the NAND gate 121 is configured for outputting the periodic pulse signal PS_b. One input of the latch circuit 122 is coupled with the output of the NAND gate 121. Another input of the latch circuit 122 receives the global clock signal GCLK. The output of the latch circuit 122 is coupled with the NAND gate 121. Based on latching function by the latch circuit 122, the pulse generating module 120 forms the periodic pulse signal PS_b, which includes periodic pulses corresponding to every rising edges of the global clock signal GCLK (as shown in FIG. 2). However, circuitry of the pulse generating module 120 is not limited to the embodiment shown in FIG. 1B. Various configurations of the pulse generating module 120 are within the contemplated scope of the present disclosure.

In operations S203, the control logic module 140 receives some control signals for controlling behavior of the clock regenerator 100. In operations S204, the control logic module 140 produces the pulse-type setting signal SET and the gating signal GATE_b according to the periodic pulse signal PS_b and the control signals.

In some embodiments shown in FIG. 1B, the control signals received by the control logic module 140 include a test-hold signal THOLD, a scan-control signal SCAN_b and a clock-gating signal CLKGATE. The test-hold signal THOLD and the scan-control signal SCAN_b are utilized to switch the clock regenerator 100 into a testing mode.

In the testing mode, providing the local clock signal LCLK or not depends on the test-hold signal THOLD and the scan-control signal SCAN_b. In some embodiments, the test-hold signal THOLD has higher priority than the scan-control signal SCAN_b. Once the test-hold signal THOLD is asserted at high level (i.e., logical "1"), the local clock signal LCLK will not be provided (fired). On the other hand, when the test-hold signal THOLD is deasserted at low level (i.e., logical "0") and the scan-control signal SCAN_b is deasserted at low level (i.e., logical "0"), the local clock signal LCLK will be provided (fired).

Besides the testing mode, when the test-hold signal THOLD is deasserted at low level (i.e., logical "0") and the scan-control signal SCAN_b is asserted at high level (i.e., logical "1"), the clock regenerator 100 is in a function mode. In the function mode (THOLD="0" and SCAN_b="1" in some embodiments), providing the local clock signal LCLK or not depends on the clock-gating signal CLKGATE. The clock-gating signal CLKGATE is utilized to turn the clock regenerator 100 into a gated state. For illustration, when the clock storage elements (not shown in figures) coupled with the clock regenerator 100 do not require the local clock signal LCLK, and the clock regenerator 100 will not provide (or fire) the local clock signal LCLK in the gated state.

When the clock-gating signal CLKGATE is deasserted at low level (i.e., logical "0") in the function mode, which means THOLD="0" and SCAN_b="1" in embodiments, the local clock signal LCLK will be provided (fired). When the clock-gating signal CLKGATE is asserted at high level (i.e., logical "0") in the function mode, which means THOLD="0" and SCAN_b="1" in embodiments, the local clock signal LCLK will not be provided, and it is called as the gated state.

Explained in a different way, in some embodiments, when the test-hold signal THOLD is deasserted at low level (i.e., logical "0") and either one of the scan-control signal SCAN_b or the clock-gating signal CLKGATE is deasserted at low level (i.e., logical "0"), the local clock signal LCLK will be fired.

In some embodiments shown in FIG. 1B, the control logic module 140 includes a logic unit 141 and a logic unit 142. The logic unit 141 is a NOR gate and the logic unit 142 is a NAND gate in embodiments illustrated in FIG. 1B. The logic unit 141 has an input for receiving the pulse-type setting signal PS_b, another input for receiving the test-hold signal THOLD, and an output for outputting the pulse-type setting signal SET. The logic unit 142 has an input for receiving the scan-control signal SCAN_b, a second input for receiving the clock-gating signal CLKGATE, and an output for outputting the gating signal GATE_b. Various configurations of the control logic module 140 are within the contemplated scope of the present disclosure.

In embodiments illustrated in FIG. 1B, the gating module 160 includes switches T1, T2, T3 and T4. As embodiments illustrated in FIG. 1B, the switch T1 is a PMOS transistor, and the switches T2, T3 and T4 are NMOS transistors. The switch T1 has a terminal coupled with a reference voltage source Vdd, another terminal coupled with the output module 180, and a gate terminal coupled with the output of the first logic unit 141 for receiving the pulse-type setting signal SET.

The switch T2 has a terminal coupled with the output module 180, another terminal coupled with the switch T3, and a gate terminal coupled with the output of the logic unit 141 for receiving the pulse-type setting signal SET.

The switch T3 has a terminal coupled with the switch T2, another terminal coupled with a reference ground, and a gate terminal coupled with the output of the logic unit 142 for receiving the gating signal GATE_b.

The switch T4 has a terminal coupled with the output module 180, another terminal to the reference ground, and a gate terminal coupled with the output of the logic unit 141 for receiving the pulse-type setting signal SET. Various configurations of the gating module 160 are within the contemplated scope of the present disclosure.

As shown in FIG. 1C and FIG. 2, in operations S205, the gating module 160 produces the intermediate clock signal CLK_b according to the pulse-type setting signal SET and the gating signal GATE_b.

The switch T2 and T3 decide falling edges of the pulse-type intermediate clock signal CLK_b. The switch T1 and T4 decide rising edges of the pulse-type intermediate clock signal CLK_b. When at least one of the scan-control signal SCAN_b and the clock-gating signal CLKGATE is fixed at low voltage level, the gating signal GATE_b is fixed at high voltage level, and such that the switch T3 is turned on. When test-hold control signal THOLD is deasserted at low voltage level, the switches T2/T4 are turned on and the switch T1 is turned off when the pulse-type setting signal SET is at high voltage level; the switches T2/T4 are turned off and the switch T1 is turned on when the pulse-type setting signal SET is at low voltage level.

In the case that the test-hold control signal THOLD is deasserted at low voltage level and at least one of the scan-control signal SCAN_b and the clock-gating signal CLKGATE is at low voltage level, when the pulse-type setting signal SET is at high voltage level, the switches T2 and T3 are turned on, such that the intermediate clock signal CLK_b is pulled low to the reference ground. When the pulse-type setting signal SET is at low voltage level, the switches T2 and T4 are turned off and switch T1 is turned on, such that the intermediate clock signal CLK_b is pulled high to the reference voltage source Vdd. Accordingly, the pulse-type setting signal SET is a reserve signal of the periodic pulse signal PS_b and the gating signal GATE_b is fixed at high voltage level (as shown in FIG. 2) when the test-hold control signal THOLD is deasserted at low voltage level and at least one of the scan-control signal SCAN_b and the clock-gating signal CLKGATE is at low voltage level.

In embodiments shown in FIG. 1B and FIG. 2, both of the falling edges and the rising edges of the pulse-type intermediate clock signal CLK_b correspond to the rising edges of the global clock signal GCLK as shown in FIG. 2.

In some embodiments shown in FIG. 1B, the output latch circuit 170 includes an inverter INV1, a switch T5 and a switch T6. The switch T5 is a PMOS transistor and the switch T6 is a NMOS transistor. The output latch circuit 170 is configured for latching the pulse-type intermediate clock signal CLK_b. Various configurations of the output latch circuit 170 are within the contemplated scope of the present disclosure.

In operations S206, the output module 180 provides the pulse-type local clock signal LCLK according to the pulse-type intermediate clock signal CLK_b. In embodiments illustrated in FIG. 1A and FIG. 1B, the output module 180 includes an inverter. The pulse-type local clock signal LCLK is formed as a reserve signal of the pulse-type intermediate clock signal CLK_b (as shown in FIG. 2). Accordingly, the clock regenerator 100 provides the pulse-type local clock signal LCLK corresponding to the rising edges of the global clock signal GCLK, as shown in FIG. 2. The pulse-type local clock signal LCLK is provided selectively in accordance with the test-hold control signal THOLD, the scan-control signal SCAN_b and the clock-gating signal CLKGATE.

Each of the pulse generating module 120, the control logic module 140, the gating module 160 and the output module 180 substantially induces one unit of delay time in sequence. For illustration, one unit of delay time mentioned here is a Fan-out of 4 (FO4) delay, which is equivalent to the delay time of an inverter. In other words, the pulse generating module 120, the control logic module 140, the gating module 160 and the output module 180 induce four FO4 delays. Therefore, the pulse-type local clock signal LCLK is launched by four units of delay time after the rising edge of the global clock signal GCLK.

The control signals, THOLD, SCAN_b and CLKGATE, are received by the control logic module 140, which is connected at the next stage of the pulse generating module 120. Therefore, the control signals, including the clock-gating signal CLKGATE, are required by one unit of delay time (e.g., one FO4 delay) after the rising edge of the global clock signal GCLK. In other words, the clock-gating signal CLKGATE can arrive later than the global clock signal GCLK by one FO4 delay.

In embodiments shown in FIG. 1A and FIG. 1B, the clock regenerator 100 provides the pulse-type local clock signal LCLK. However, the disclosure is not limited to this.

Figure 3A:
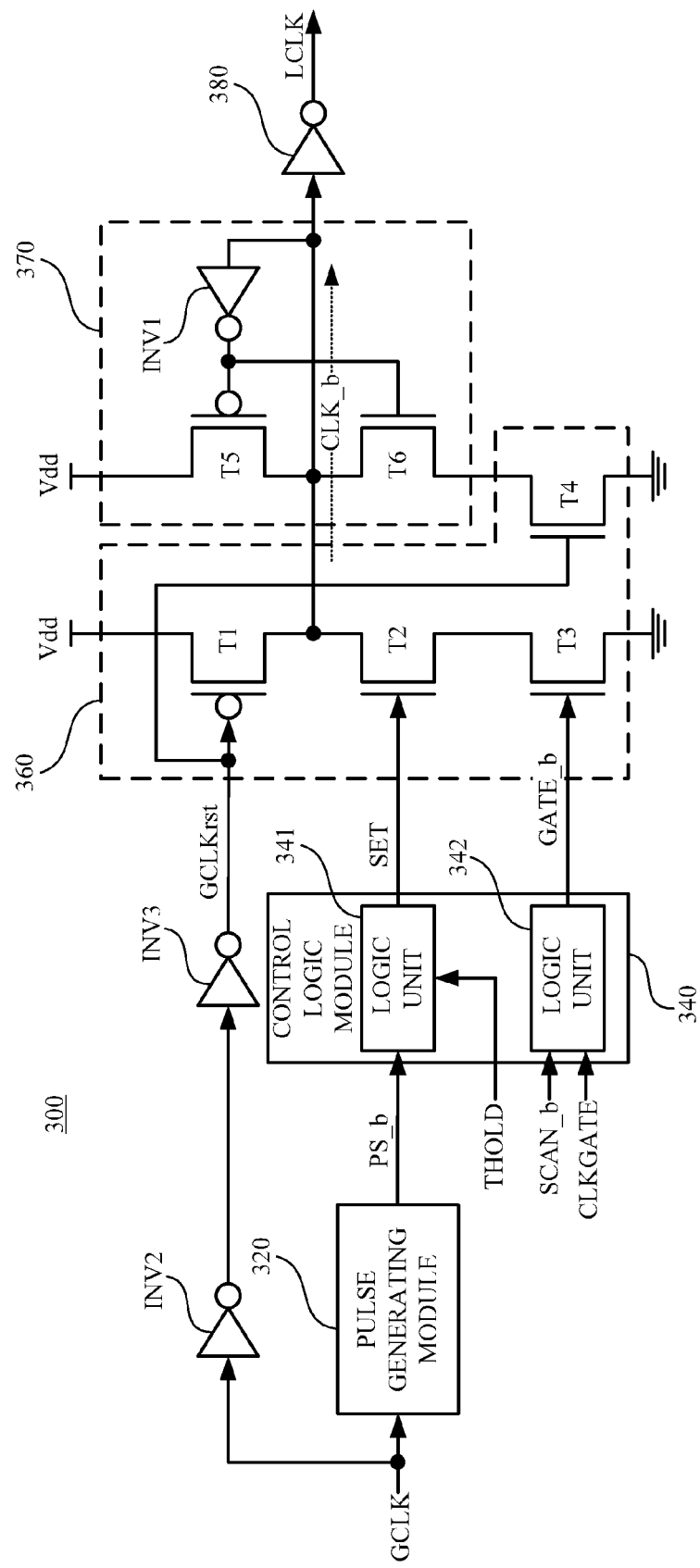
FIG. 3A is a schematic diagram illustrating a clock regenerator according to some embodiments of the present disclosure.
Figure 3B:
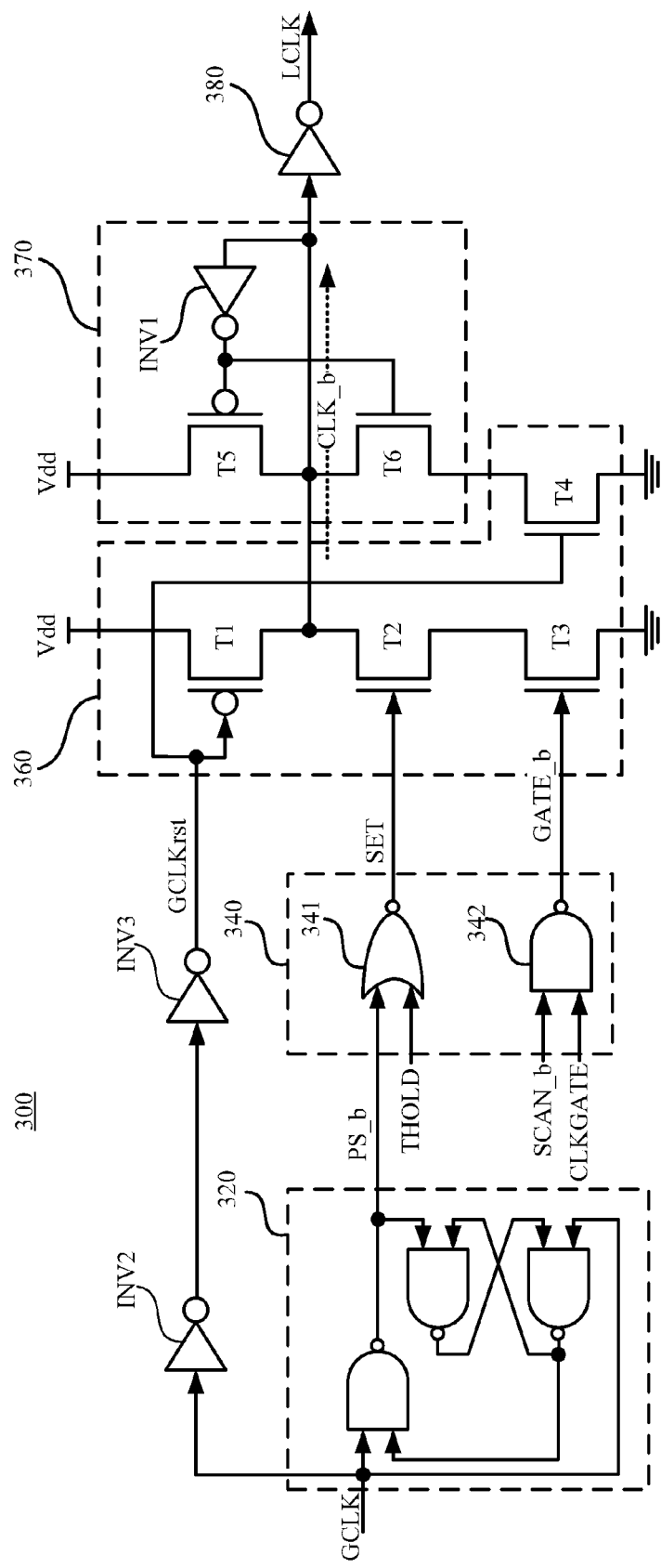
FIG. 3B is a schematic diagram illustrating circuit structure of the clock regenerator according to some embodiments of the present disclosure.
Figure 3C:
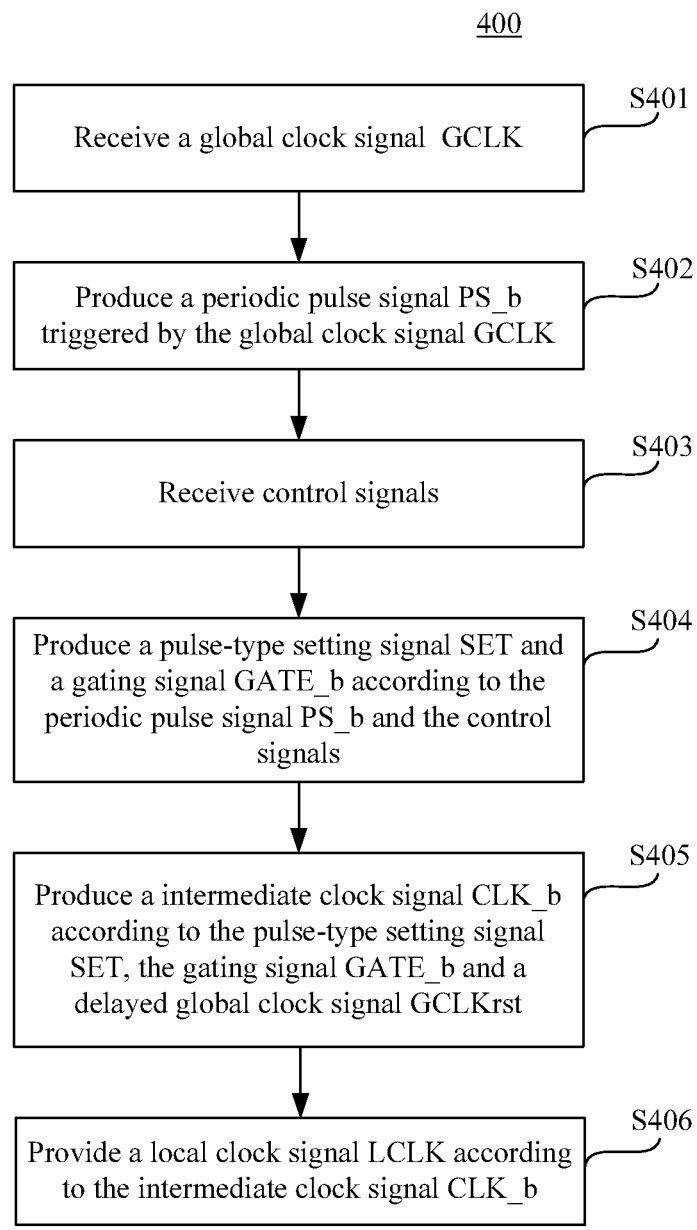
FIG. 3C is a schematic diagram illustrating a clock regenerating method according to some embodiments of the present disclosure.
Figure 4:
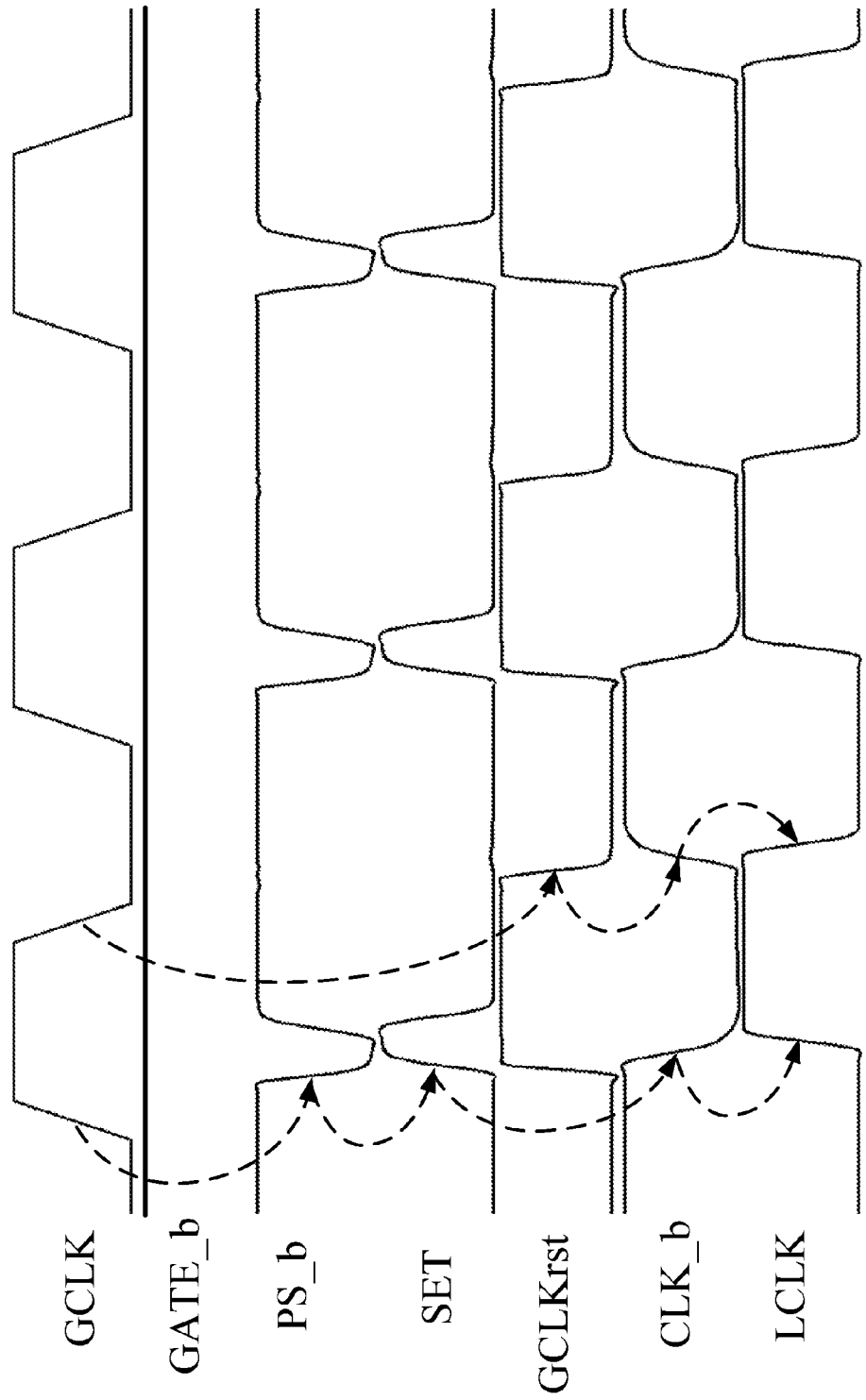
FIG. 4 is a waveform diagram illustrating related signals of the clock regenerator in FIGS. 3A and 3B.

Reference is made to FIG. 3A, FIG. 3B, FIG. 3C and FIG. 4. FIG. 3A is a schematic diagram illustrating a clock regenerator 300 according to some embodiments of the present disclosure. FIG. 3B is a schematic diagram illustrating circuit structure of the clock regenerator 300 according to some embodiments of the present disclosure. FIG. 4 is a waveform diagram illustrating related signals of the clock regenerator 300 according to some embodiments of the present disclosure. As shown in FIG. 3A, the clock regenerator 300 includes a pulse generating module 320, a control logic module 340, a gating module 360 and an output module 380. In some embodiments as shown in FIG. 3A, the clock regenerator 300 further includes an output latch circuit 370 disposed between the gating module 360 and the output module 380. FIG. 3C is a schematic diagram illustrating a clock regenerating method 400 according to some embodiments of the present disclosure. The clock regenerating method 400 is utilized on the clock regenerator 300 in some embodiments.

In some embodiments, the clock regenerator 300 serves as a distributed clock regenerator (DCR). The clock regenerator 300 is utilized for re-generating a local clock signal LCLK from a global clock signal GCLK. In embodiments illustrated in FIG. 3A, FIG. 3B and FIG. 4, the local clock signal LCLK generated by the clock regenerator 300 is a level-mode local clock signal LCLK.

As shown in FIG. 3A, FIG. 3C and FIG. 4, in operations S401 and S402, the pulse generating module 320 receives the global clock signal GCLK and produces a periodic pulse signal PS_b triggered by rising edges of the global clock signal GCLK (as shown in FIG. 2).

In some embodiments illustrated in FIG. 3B, the pulse generating module 320 includes a NAND gate 321 and a latch circuit 322. Based on latching function by the latch circuit 322, the pulse generating module 320 forms the periodic pulse signal PS_b, which includes periodic pulses corresponding to every rising edges of the global clock signal GCLK (as shown in FIG. 4). Details of the pulse generating module 320 can be referred to aforesaid embodiments related to the pulse generating module 120 in FIG. 1B, and not to be repeated here again.

As shown in FIG. 3A, FIG. 3C and FIG. 4, the control logic module 340 is coupled with the pulse generating module 320. In operations S403, the control logic module 340 receives some control signals for controlling behavior of the clock regenerator 300. In operations S404, the control logic module 340 produces a pulse-type setting signal SET and a gating signal GATE_b according to the periodic pulse signal PS_b and the control signals.

In some embodiments, the control signals received by the control logic module 340 include a test-hold signal THOLD, a scan-control signal SCAN_b and a clock-gating signal CLKGATE. If the test-hold control signal THOLD is at high voltage level, or if both of the scan-control signal SCAN_b and the clock-gating signal CLKGATE are at high voltage level, the gating module 360 is activated for blocking the global clock signal GCLK and the periodic pulse signal PS_b from affecting the level-type intermediate clock signal CLK_b and the level-type local clock signal LCLK. In this case when the gating module 360 is activated for blocking, the local clock signal LCLK will not be provided (or fired).

In some embodiments, the control logic module 340 includes a logic unit 341 and a logic unit 342. The logic unit 341 is a NOR gate and the logic unit 342 is a NAND gate in embodiments illustrated in FIG. 3B. Details of the control logic module 340 can be referred to aforesaid embodiments related to the control logic module 140 in FIG. 1B, and not to be repeated here again.

When the gating module 360 is not activated for blocking, the pulse-type setting signal SET is a reserve signal of the periodic pulse signal PS_b, and the gating signal GATE_b is fixed at high voltage level (as shown in FIG. 4).

In embodiments illustrated in FIG. 3B, the gating module 360 includes switches T1, T2, T3 and T4. Compared to embodiments shown in FIG. 1B, the switches T1 and T4 of the embodiments illustrated in FIG. 3B are controlled by a delayed global clock signal GCLKrst, instead of being controlled by the pulse-type setting signal SET. The delayed global clock signal GCLKrst is similar to the original global clock signal GCLK. The gating module 360 is two stages of delay time later than the pulse generating module 320. The pulse-type setting signal SET is ready by two units of delay time after the global clock signal GCLK. In order to synchronize arriving timings of the gate-controlling signals to the switches T1, T2, T3 and T4, two inverters INV2 and INV3 are disposed for simulating two units of delay time and converting the global clock signal GCLK into the delayed global clock signal GCLKrst.

As shown in FIG. 3A, FIG. 3C and FIG. 4, in operations S405, the gating module 360 produces the intermediate clock signal CLK_b according to the pulse-type setting signal SET, the gating signal GATE_b and the delayed global clock signal GCLKrst.

The switch T2 and T3 decide falling edges of the level-type intermediate clock signal CLK_b. The switch T1 and T4 decide rising edges of the pulse-type intermediate clock signal CLK_b.

The switch T2 and T3 decide falling edges of the pulse-type intermediate clock signal CLK_b. The switch T1 and T4 decide rising edges of the pulse-type intermediate clock signal CLK_b. When at least one of the scan-control signal SCAN_b and the clock-gating signal CLKGATE is fixed at low voltage level, the gating signal GATE_b is fixed at high voltage level, and such that the switch T3 is turned on. In the case that test-hold control signal THOLD is deasserted at low voltage level, the switches T2 is turned on when the pulse-type setting signal SET is at high voltage level; the switches T4 are turned off and the switch T1 is turned on when the delayed global clock signal GCLKrst is at low voltage level.

In the case that the test-hold control signal THOLD is deasserted at low voltage level and at least one of the scan-control signal SCAN_b and the clock-gating signal CLKGATE is deasserted at low voltage level, when the pulse-type setting signal SET is at high voltage level, the switches T2 and T3 are turned on, such that the intermediate clock signal CLK_b is pulled low to the reference ground. When the delayed global clock signal GCLKrst is at low voltage level, the switches T2 and T4 are turned off and switch T1 is turned on, such that the intermediate clock signal CLK_b is pulled high to the reference voltage source Vdd.

Accordingly, when the test-hold control signal THOLD is deasserted at low voltage level and at least one of the scan-control signal SCAN_b and the clock-gating signal CLKGATE is deasserted at low voltage level, falling edges of the level-type intermediate clock signal CLK_b correspond to rising edges of the pulse-type setting signal SET, and rising edges of the level-type intermediate clock signal CLK_b correspond to falling edges of the delayed global clock signal GCLKrst and also the global clock signal GCLK, as shown in FIG. 4.

On the other hand, when one of the test-hold control signal THOLD is at high voltage level, or both of the scan-control signal SCAN_b and the clock-gating signal CLKGATE are at high voltage level, at least one of the pulse-type setting signal SET and the gating signal GATE_b is fixed at low voltage level, such that the intermediate clock signal CLK_b will be fixed at high voltage level, and the intermediate clock signal CLK_b will not response to the global clock signal GCLK (not shown in FIG. 2).

In some embodiments, the output latch circuit 370 includes an inverter INV1, a switch T5 and a switch T6. The output latch circuit 370 is configured for latching the level-type intermediate clock signal CLK_b.

In operations S406, the output module 380 provides the level-type local clock signal LCLK according to the level-type intermediate clock signal CLK_b.

Each of the pulse generating module 320, the control logic module 340, the gating module 360 and the output module 380 substantially induces one unit of delay time in sequence. For illustration, one unit of delay time mentioned here is a Fan-out of 4 (FO4) delay, which is equivalent to the delay time of an inverter. Therefore, the level-type local clock signal LCLK is launched by four units of delay time after the rising edge of the global clock signal GCLK.

The control signals, THOLD, SCAN_b and CLKGATE, are received by the control logic module 340, which is connected at the next stage of the pulse generating module 320. Therefore, the control signals, including the clock-gating signal CLKGATE, are required by one unit of delay time (e.g., one FO4 delay) after the rising edge of the global clock signal GCLK. In other words, the clock-gating signal CLKGATE can arrive later than the global clock signal GCLK by one FO4 delay.

Other details of the clock regenerator 300 in FIG. 3A, FIG. 3B and FIG. 4 can be referred to the clock regenerator 100 in aforesaid embodiments.

The clock regenerator 100 in aforesaid embodiments discloses how to generate the pulse-type local clock signal LCLK. The clock regenerator 300 in aforesaid embodiments discloses how to generate the level-type local clock signal LCLK. However, the clock regenerator in this disclosure is not limited to generate only one type of the local clock signal LCLK.

Figure 5A:
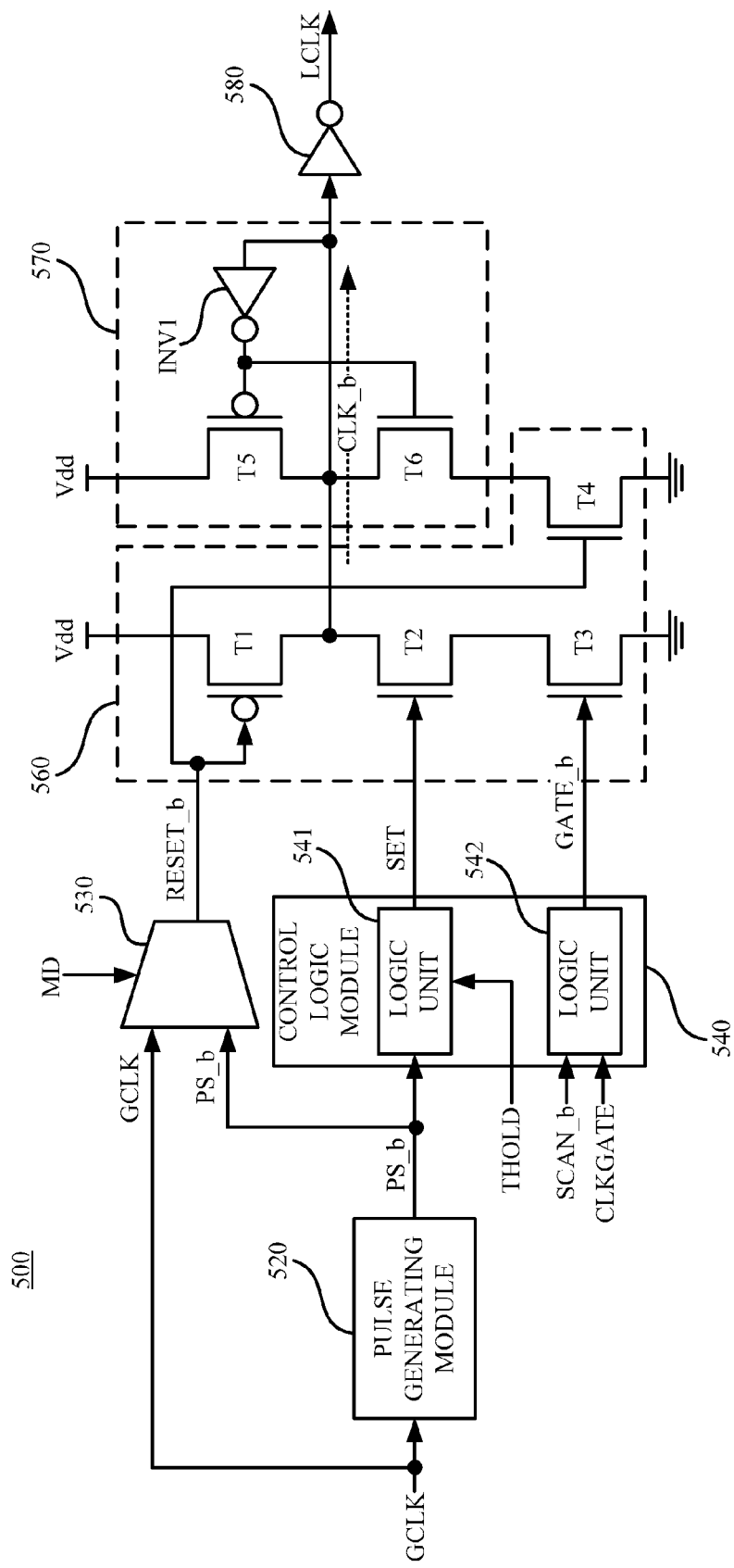
FIG. 5A is a schematic diagram illustrating a clock regenerator according to some embodiments of the present disclosure.
Figure 5B:
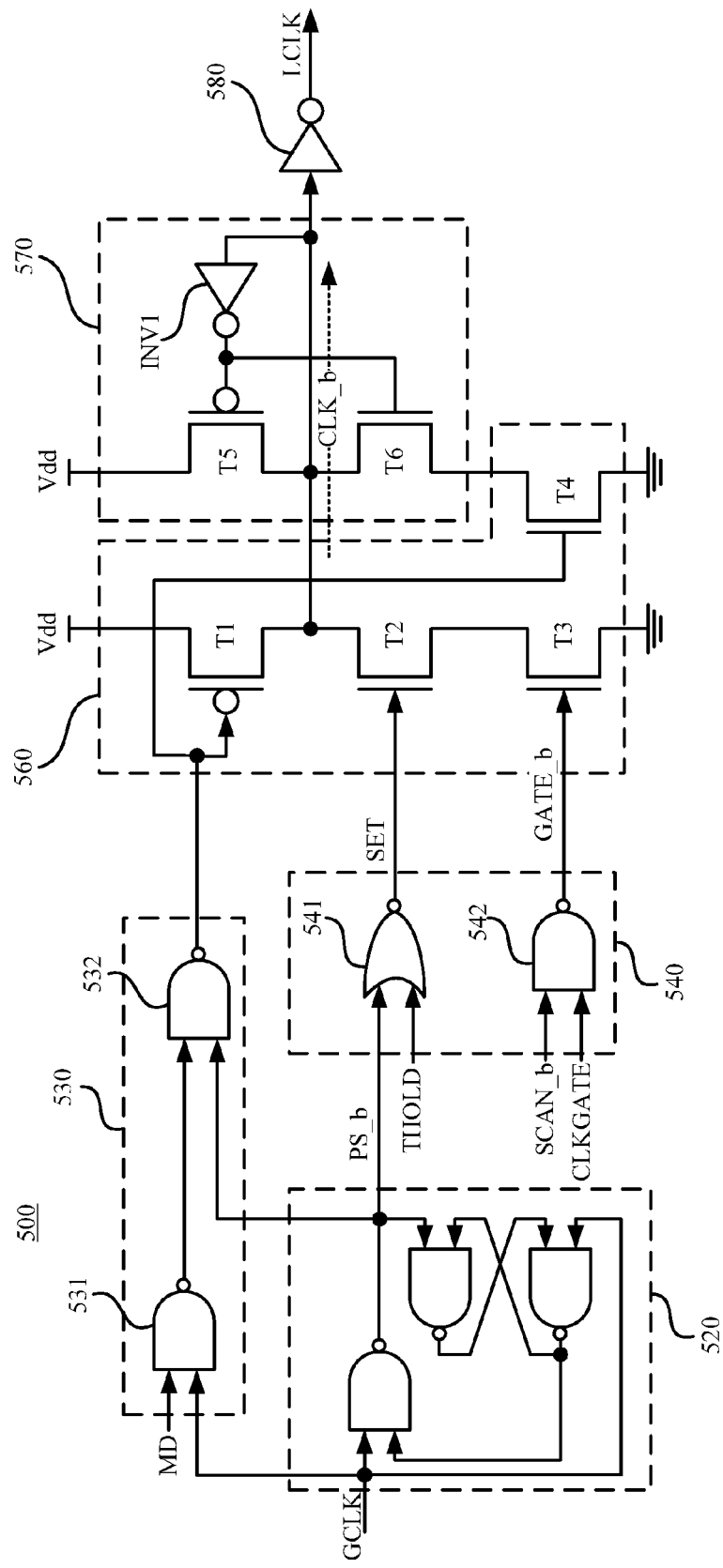
FIG. 5B is a schematic diagram illustrating circuit structure of the clock regenerator according to some embodiments of the present disclosure.
Figure 5C:
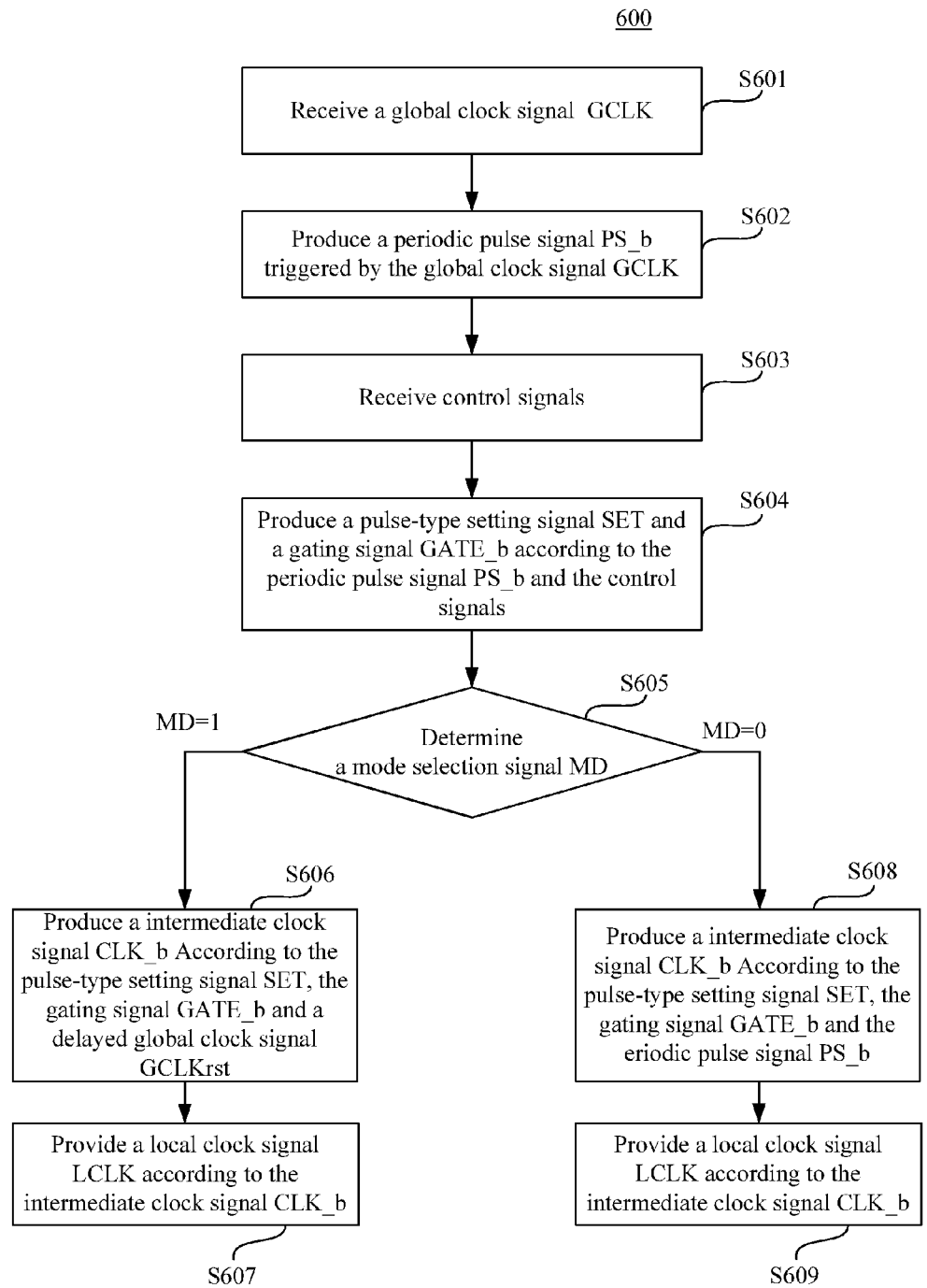
FIG. 5C is a schematic diagram illustrating a clock regenerating method according to some embodiments of the present disclosure.

Reference is made to FIG. 5A, FIG. 5B and FIG. 5C. FIG. 5A is a schematic diagram illustrating a clock regenerator 500 according to some embodiments of the present disclosure. FIG. 5B is a schematic diagram illustrating circuit structure of the clock regenerator 500 according to some embodiments of the present disclosure. As shown in FIG. 5A, the clock regenerator 500 includes a pulse generating module 520, a control logic module 540, a gating module 560, an output latch circuit 570 and an output module 580. FIG. 5C is a schematic diagram illustrating a clock regenerating method 600 according to some embodiments of the present disclosure. The clock regenerating method 600 is utilized on the clock regenerator 500 in some embodiments.

In addition, the clock regenerator 500 further includes a mode selector 530. The mode selector 530 is coupled with the pulse generating module 520. The mode selector 530 is configured to receive a mode selection signal MD, the global clock signal GCLK and the periodic pulse signal PS_b. The mode selector 530 is configured to output the global clock signal GCLK or the periodic pulse signal PS_b selectively to the gating module 560 according to the mode selection signal MD. The mode selector 530 is a multiplexer operated according to the mode selection signal MD in some embodiments.

In embodiments shown in FIG. 5A, 5B and FIG. 5C, in operations S605, the mode selection signal MD is received and determine whether the clock regenerator 500 is set at pulse or level mode.

If the mode selection signal MD is set at high level, regarding as logical "1", the mode selector 530 will select the global clock signal GCLK as a reset signal RESET_b, which is sent to the switch T1 and the switch T4 of the gating module 560. As shown in operations S606, the gating module 560 produces an intermediate clock signal CLK_b according to the pulse-type setting signal SET, the gating signal GATE_b and a delayed global clock signal GCLKrst. In this mode, the behaviors of the clock regenerator 500 will be similar to the clock regenerator 300 in FIG. 3A and FIG. 3B, and the waveforms of related signals can be referred to FIG. 4.

On the other hand, if the mode selection signal MD is set at low level, regarding as logical "0", the mode selector 530 will select the periodic pulse signal PS_b as the reset signal RESET_b, which is sent to the switch T1 and the switch T4 of the gating module 560. As shown in operations S608, the gating module 560 produces an intermediate clock signal CLK_b according to the pulse-type setting signal SET, the gating signal GATE_b and the periodic pulse signal PS_b. In this mode, the behaviors of the clock regenerator 500 will be similar to the clock regenerator 100 in FIG. 1A and FIG. 1B, and the waveforms of related signals can be referred to FIG. 2.

In operations S606 or S608, the gating module 560 produces an intermediate clock signal CLK_b in pulse-type (referring to FIG. 2) or level-type (referring to FIG. 4) according to the pulse-type setting signal SET, the gating signal GATE_b and the reset signal RESET_b, which is equal to the global clock signal GCLK or the periodic pulse signal PS_b from the mode selector 530.

In operations S607 or S609, the output module 580 provides the local clock signal LCLK in pulse-type (referring to FIG. 2) or level-type (referring to FIG. 4) according to the intermediate clock signal CLK_b.

Details and other behaviors of the pulse generating module 520, the control logic module 540, the gating module 560, the output latch circuit 570 and the output module 580 are already disclosed in aforesaid embodiment, and not to be repeated here.

Figure 6:
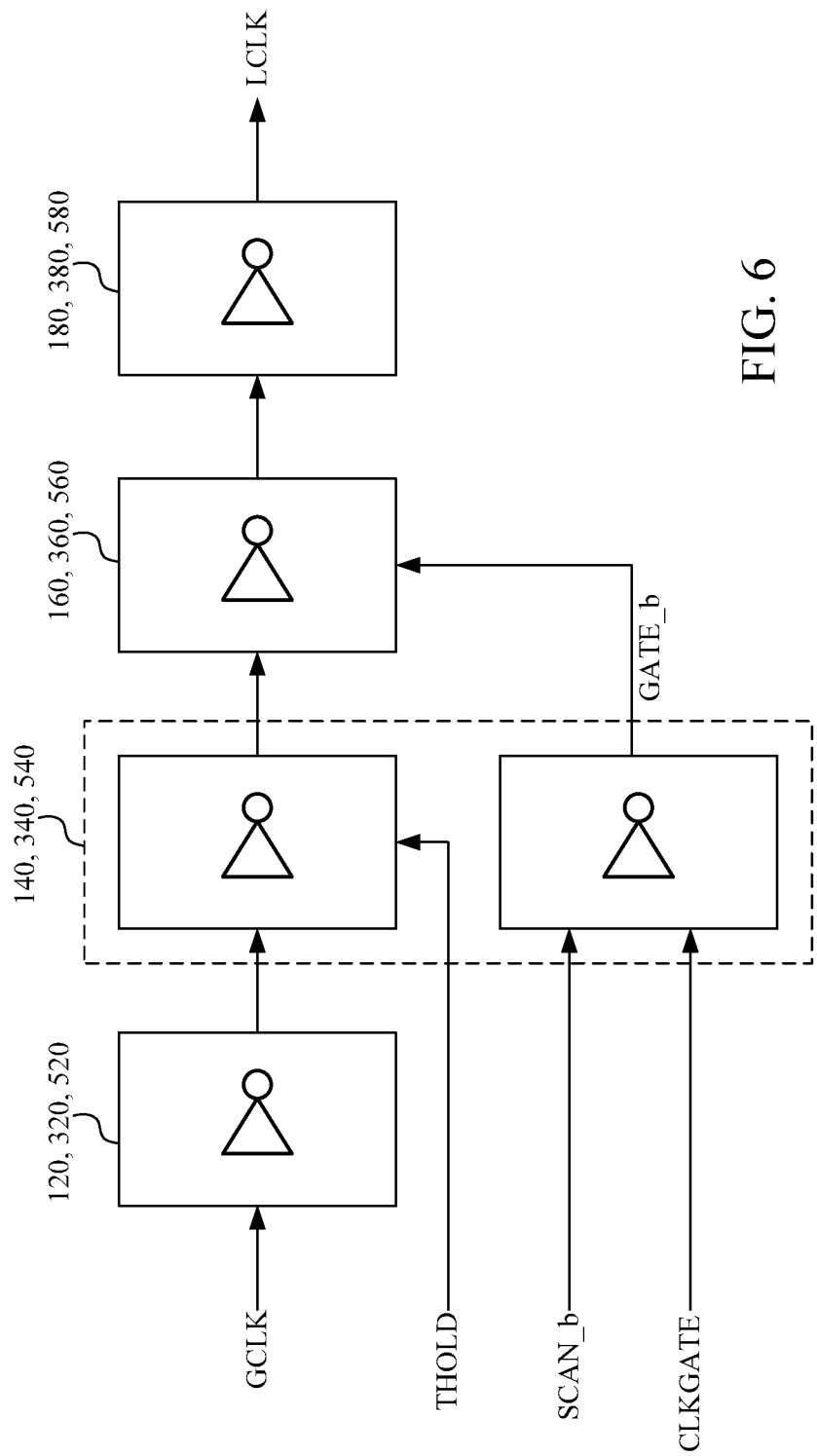
FIG. 6 is a schematic diagram illustrating a timing relationship between the control signals and the global clock signal in the clock regenerator according to aforesaid embodiments.

Reference is also made to FIG. 6, which is a schematic diagram illustrating a timing relationship between the control signals THOLD, SCAN_b, CLKGATE and the global clock signal GCLK in the clock regenerator 100, 300 or 500 according to aforesaid embodiments.

As shown in FIG. 6, each one of the pulse generating module 120/320/520, the control logic module 140/340/540, the gating module 160/360/560 and the output module 180/380/580 substantially induces one unit of delay time in sequence. For illustration, one unit of delay time mentioned here is a Fan-out of 4 (FO4) delay, which is equivalent to the delay time of an inverter. In other words, the pulse generating module 120/320/520, the control logic module 140/340/540, the gating module 160/360/560 and the output module 180/380/580 totally induce four FO4 delays. Therefore, the local clock signal LCLK is launched by four units of delay time after the rising edge of the global clock signal GCLK.

The control signals, THOLD, SCAN_b and CLKGATE, are received by the control logic module 140/340/540, which is connected at the next stage of the pulse generating module 120/320/520. Therefore, the control signals, THOLD, SCAN_b and CLKGATE, can be set up later than the global clock signal GCLK is triggered. In other words, the control signals, including the clock-gating signal CLKGATE, are required by one unit of delay time (e.g., one FO4 delay) after the rising edge of the global clock signal GCLK. In this case, the clock-gating signal CLKGATE can arrive later than the global clock signal GCLK by one FO4 delay, such that it will give the clock-gating signal CLKGATE more time for setting up, extenuate the critical path happened on the clock-gating signal CLKGATE, and reducing the total cycling time in a clock-network system involving the clock regenerator 100 and the clock storage elements (not shown in figures).

In some embodiments, a clock regenerator is disclosed that includes a pulse generating module, a control logic module, a gating module and an output module. The pulse generating module is configured to receive a global clock signal and produce a periodic pulse signal triggered by a rising edge of the global clock signal. The control logic module is configured to receive a plurality of control signals and produce a pulse-type setting signal and a gating signal according to the periodic pulse signal and the control signals. The gating module is configured to produce an intermediate clock signal according to the pulse-type setting signal and the gating signal. The output module is configured to provide a local clock signal according to the intermediate clock signal.

Also disclosed is a clock regenerating method. In the clock regenerating method, a global clock signal is received. A periodic pulse signal triggered by the global clock signal is produced. Control signals are received. A pulse-type setting signal and a gating signal are produced according to the periodic pulse signal and the control signals. An intermediate clock signal is produced according to the pulse-type setting signal and the gating signal. A local clock signal is provided according to the intermediate clock signal.

Also disclosed is a clock regenerator, which includes a pulse generating module, a mode selector, a control logic module, a first switch, a second switch, a third switch and an output module. The pulse generating module is configured to receive a global clock signal and produce a periodic pulse signal triggered by a rising edge of the global clock signal. The control logic module is configured to receive a plurality of control signals and produce a pulse-type setting signal and a gating signal according to the periodic pulse signal and the control signals. The first switch has a first terminal coupled with a reference voltage source, a second terminal, and a gate terminal. The second switch has a first terminal coupled with the second terminal of the first switch for forming an intermediate clock signal, a second terminal, and a gate terminal configured to receive the pulse-type setting signal. The third switch has a first terminal coupled with the second terminal of the second switch, a second terminal coupled with a reference ground, and a gate terminal configured to receive the gating signal. The output module is configured to provide a local clock signal according to the intermediate clock signal.

In this document, the term "coupled" may be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

It will be apparent to those skilled in the art that various modifications and variations can be made to the structure of the present disclosure without departing from the scope or spirit of the application. In view of the foregoing, it is intended that the present disclosure cover modifications and variations of this application provided they fall within the scope of the following claims.

What is claimed is:
1. A clock regenerator, comprising:
 a pulse generating module, configured to receive a global clock signal and produce a periodic pulse signal triggered by a rising edge of the global clock signal;
 a control logic module, configured to receive a plurality of control signals and produce a pulse-type setting signal and a gating signal according to the periodic pulse signal and the control signals;

a gating module, configured to produce an intermediate clock signal according to the pulse-type setting signal and the gating signal;
an output module, configured to provide a local clock signal according to the intermediate clock signal; and
a mode selector, configured to receive a mode selection signal and the global clock signal, and configured to output the global clock signal or the periodic pulse signal to the gating module selectively according to the mode selection signal.

2. The clock regenerator of claim 1, wherein each of the pulse generating module, the control logic module, the gating module and the output module substantially induces one unit of delay time in sequence, the local clock signal is launched by four units of delay time after the rising edge of the global clock signal.

3. The clock regenerator of claim 2, wherein the control logic module receives the control signals by one unit of delay time after the rising edge of the global clock signal.

4. The clock regenerator of claim 1, wherein the gating module is configured to produce an intermediate clock signal in pulse-type or level-type according to the pulse-type setting signal, the gating signal, and the global clock signal or the periodic pulse signal from the mode selector, and output module is configured to provide the local clock signal in pulse-type or level-type according to the intermediate clock signal, and the control signals received by the control logic module comprise a test-hold signal, a scan-control signal and a clock-gating signal, the gating module is configured for blocking the global clock signal from affecting the intermediate clock signal selectively in accordance with the test-hold signal, the scan-control signal and the clock-gating signal.

5. The clock regenerator of claim 4, wherein the control logic module comprises:
a first logic unit, having a first input for receiving the periodic pulse signal, a second input for receiving the test-hold signal, and an output for outputting the pulse-type setting signal; and
a second logic unit, having a first input for receiving the scan-control signal, a second input for receiving the clock-gating signal, and an output for outputting the gating signal;
and the gating module comprises:
a first switch, having a first terminal coupled with a reference voltage source, a second terminal coupled with the output module, and a gate terminal coupled with the mode selector;
a second switch, having a first terminal coupled with the output module, a second terminal, and a gate terminal coupled with the output of the first logic unit;
a third switch, having a first terminal coupled with the second terminal of the second switch, a second terminal coupled with a reference ground, and a gate terminal coupled with the output of the second logic unit; and
a fourth switch, having a first terminal coupled with the output module, a second terminal to the reference ground, and a gate terminal with the mode selector.

6. The clock regenerator of claim 4, wherein first edges of the intermediate clock signal in level-type correspond to the pulse-type setting signal, and second edges of the intermediate clock signal in level-type correspond to the global clock signal.

7. The clock regenerator of claim 1, further comprises an output latch circuit disposed between the gating module and the output module for latching the intermediate clock signal.

8. A clock regenerating method, comprising:
receiving a global clock signal;
producing a periodic pulse signal triggered by the global clock signal;
receiving a plurality of control signals;
producing a pulse-type setting signal and a gating signal according to the periodic pulse signal and the control signals;
receiving a mode selection signal;
producing an intermediate clock signal according to the pulse-type setting signal and the gating signal, the intermediate clock signal is produced in pulse-type or level-type selectively according to the mode selection signal; and
providing a local clock signal according to the intermediate clock signal.

9. The clock regenerating method of claim 8, wherein the periodic pulse signal triggered by a rising edge of the global clock signal.

10. The clock regenerating method of claim 9, wherein the control signals are received by one unit of delay time after the rising edge of the global clock signal.

11. A clock regenerator, comprising:
a pulse generating module, configured to receive a global clock signal and produce a periodic pulse signal triggered by a rising edge of the global clock signal;
a control logic module, configured to receive a plurality of control signals and produce a pulse-type setting signal and a gating signal according to the periodic pulse signal and the control signals;
a first switch, having a first terminal coupled with a reference voltage source, a second terminal, and a gate terminal;
a second switch, having a first terminal coupled with the second terminal of the first switch for forming an intermediate clock signal, a second terminal, and a gate terminal configured to receive the pulse-type setting signal;
a third switch, having a first terminal coupled with the second terminal of the second switch, a second terminal coupled with a reference ground, and a gate terminal configured to receive the gating signal;
an output module, configured to provide a local clock signal according to the intermediate clock signal; and
a mode selector, configured to receive a mode selection signal and the global clock signal, and configured to output the global clock signal or the periodic pulse signal to the gate terminal of the first switch selectively according to the mode selection signal.

12. The clock regenerator of claim 11, wherein the control logic module receives the control signals by one unit of delay time after the rising edge of the global clock signal.

13. The clock regenerator of claim 11, wherein the second switch and the third switch are configured for setting the intermediate clock signal, and the first switch is configured for resetting the intermediate clock signal.

14. A clock regenerator, comprising:
a pulse generating module, configured to receive a global clock signal and produce a periodic pulse signal triggered by a rising edge of the global clock signal;
a control logic module, configured to receive a plurality of control signals and produce a pulse-type setting signal and a gating signal according to the periodic pulse signal and the control signals;
a gating module, configured to produce an intermediate clock signal according to the pulse-type setting signal and the gating signal; and
an output module, configured to provide a local clock signal according to the intermediate clock signal, wherein each of the pulse generating module, the control logic module, the gating module and the output module substantially induces one unit of delay time in sequence, the local clock signal is launched by four units of delay time after the rising edge of the global clock signal.

* * * * *